United States Patent [19]

Manocha et al.

[11] Patent Number: 5,461,005
[45] Date of Patent: Oct. 24, 1995

[54] METHOD OF FORMING SILICIDE IN INTEGRATED CIRCUIT MANUFACTURE

[75] Inventors: Ajit Manocha, Allentown, Lehigh County; Sailesh M. Merchant, Bethlehem, Northampton County; Ranbir Singh, Whitehall, Lehigh County, all of Pa.

[73] Assignee: AT&T IPM Corp., Coral Gables, Fla.

[21] Appl. No.: 814,844

[22] Filed: Dec. 27, 1991

[51] Int. Cl.$^6$ .................................................. H01L 21/283
[52] U.S. Cl. ........................ 437/200; 437/193; 437/195; 437/228; 148/DIG. 19
[58] Field of Search .................................. 437/200, 192, 437/203, 195, 52, 193, 228; 148/DIG. 19

[56] References Cited

U.S. PATENT DOCUMENTS

| | | | |
|---|---|---|---|
| 4,453,306 | 6/1984 | Lynch et al. | 437/984 |
| 4,581,815 | 4/1986 | Cheung et al. | 148/DIG. 147 |
| 4,666,737 | 5/1987 | Gimpelson et al. | 437/192 |
| 4,720,908 | 1/1988 | Wills | 437/203 |
| 4,751,197 | 6/1988 | Wills | 437/192 |
| 4,935,376 | 6/1990 | Hillenius et al. | 437/200 |
| 5,026,666 | 6/1991 | Hills et al. | 437/195 |

FOREIGN PATENT DOCUMENTS 0282629  9/1988  European Pat. Off. ............... 437/203

OTHER PUBLICATIONS

J. Electrochemical Society, vol. 137, No. 2, Feb. 1990, "The Application of Ion Beam Mixing, Doped Silicide, and Rapid Thermal Processing to Self-Aligned Silicide Technology," by Ku et al., pp. 729–740.

Applied Physics Letters, 48(23), Jun. 9, 1986, "Morphological Degradation of TiSi$_2$ on 100 Silicon," by P. Reversz, et al., pp. 1591–1593.

J. of Applied Physics 57(12), Jun. 15, 1985, "Metastable Phase Formation in Titanium–Silion Thin Films," by Robert Beyers and Robert Sinclair, pp. 5240–5245.

Primary Examiner—T. N. Quach
Attorney, Agent, or Firm—Richard D. Laumann

[57] ABSTRACT

Electrical discontinuities in a silicide formed on a patterned surface are prevented by forming metal fillets in the recesses of the patterned polysilicon covered surface, and then depositing a metal layer and reacting with silicon to form the silicide. The fillet provides extra metal at a place where there is typically a deficiency in conventional deposition techniques.

6 Claims, 1 Drawing Sheet

METHOD OF FORMING SILICIDE IN INTEGRATED CIRCUIT MANUFACTURE

TECHNICAL FIELD

This invention relates to a method of semiconductor integrated circuit manufacturing in which a metallic silicide is formed.

BACKGROUND OF THE INVENTION

Semiconductor integrated circuits typically have thousands of devices, such as field effect transistors with source/drain regions and a gate electrode, which must be electrically contacted. The transistors are frequently contacted through openings or windows in a patterned dielectric which expose at least portions of the source/drain regions or gate electrode. Additionally, electrical connections between devices must be made, e.g., from the gate of one transistor to the source/drain region of another transistor or between source/drain regions of different nearby transistors. These connections are frequently referred to as local interconnects and often run over intervening features such as runners. The local interconnects, which may be formed of polysilicon or titanium nitride (TIN), are electrically isolated from the underlying features by a dielectric layer.

The metal of choice for many integrated circuit applications has been aluminum. This metal is relatively easy to deposit and then pattern by etching, and has a relatively high electrical conductivity. However, aluminum exhibits drawbacks at submicron dimensions for local interconnects. Typically, processes that use local interconnects subject devices to temperatures greater than 800° C. after the local interconnect has been formed. This temperature makes it virtually impossible to use aluminum as a local interconnect. Further, aluminum interconnects are prone to failure because of, e.g., electromigration.

Accordingly, alternatives to aluminum have been sought. One extensively investigated alternative to aluminum is formed by the group of metallic silicides such as titanium or tantalum silicide. The silicon to metal ratio of deposited silicides is very hard to control and makes deposited silicides unsuitable for manufacture. Additionally, deposited silicides are not self-aligned. Alternatively, silicides are frequently formed by depositing a metal layer on silicon and heating the two materials so that they react to form the desired silicide. The reaction rate between many metals and silicon is reasonably fast and controlled at silicide formation temperatures. These temperatures are compatible with the integrated circuit processing sequence. Unreacted metal, if any, may be removed after heating is completed. This process is conceptually simple but requires appropriate amounts of metal and silicon so that a silicide is formed everywhere. Silicides are frequently used to increase the conductivity of polysilicon features, such as runners or local interconnects, because the silicide has a higher conductivity than does the polysilicon.

However, problems may arise in the implementation of the silicide forming, i.e., siliciding, process described. This is especially true when silicided local interconnects are formed over relatively closely spaced features. For example, a layer of silicide forming metal such as titanium may be deposited after polysilicon has been deposited and patterned to form conductive features. However, sputtered titanium does not deposit conformally on the polysilicon and the titanium thins at the bottom edges of the region between the features due to shadowing. The lack of metal in this area results in very little silicide formation at the bottom edges. Agglomeration of thin silicide at the bottom edges of runners can lead to undesirably high resistances or, in the worst case, an open circuit.

The properties of titanium silicides are discussed in the literature. See, for example, Applied Physics Letters, 48, pp. 1591–1593, Jun. 9, 1986 and Journal of Applied Physics, 57, pp. 5240–5245, Jun. 15, 1985.

SUMMARY OF THE INVENTION

A method of integrated circuit manufacture is described in which a conducting compound is formed on a surface having features by depositing a layer of polysilicon and a first layer of a conducting compound forming metal on the polysilicon; etching said metal to leave metal fillets; depositing a second layer of a conducting compound forming metal; and forming a conducting compound by heating. In one exemplary embodiment, the conducting compound comprises a silicide. In a preferred embodiment, the patterned surface comprises polysilicon runners, i.e., the features are runners. In yet another embodiment, a dielectric layer is deposited and patterned to form openings which expose selected portions of the substrate before the polysilicon is deposited.

For reasons of clarity, the elements depicted are not shown to scale.

DETAILED DESCRIPTION

A particular embodiment of the invention will be discussed by reference to FIGS. 1–4. Other embodiments will be evident to those skilled in the art.

Figure 1:
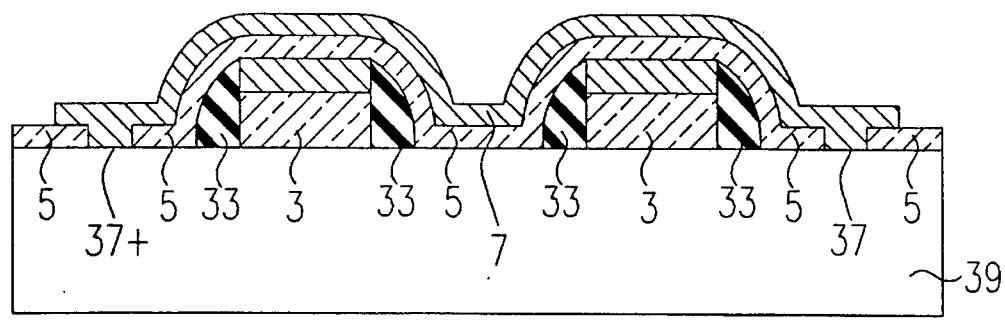
FIGS. 1–4 are sectional views of a portion of an integrated circuit at several stages during fabrication according to an embodiment of this invention.
Figure 2:
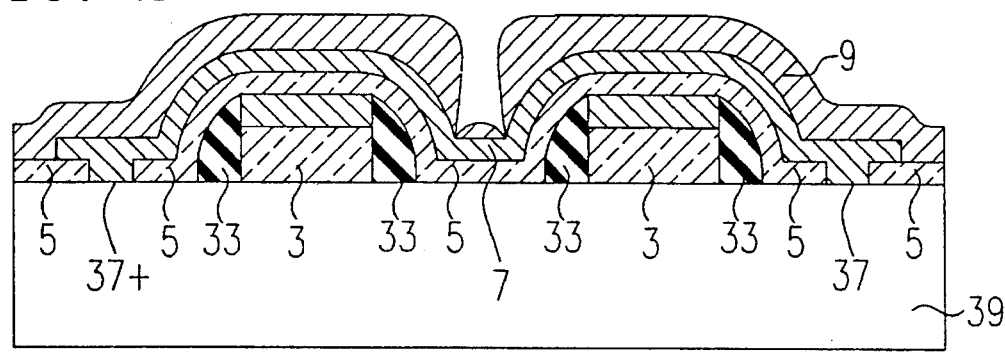

FIG. 1 is a sectional view of a portion of an integrated circuit at an early stage of fabrication according to this invention. Depicted are substrate 1, features 3, dielectric layer 5, and polysilicon layer 7. The term substrate is used to mean any material which lies beneath and supports another material and may be silicon, polysilicon, etc. The features have conductive layers 31, sidewalls 33, and top layer 35. The dielectric layer 5 has been patterned to form openings 37 which expose selected portions of the substrate such as source/drain regions 39 of field-effect transistors. The polysilicon layer may comprise runners which are formed by depositing a polysilicon layer and then patterning the polysilicon. As depicted, the polysilicon layer 7 extends between openings 37. Those skilled in the art will readily select appropriate deposition and patterning techniques for the polysilicon and also fabricate the features on the substrate. A conducting compound forming metal layer 9 is typically deposited by a technique such as sputtering. An exemplary metal is titanium. The metal does not deposit conformally and the layer has a nonuniform thickness. As can be seen in FIG. 2, the layer 9 is thinner at the bottom edges of the recess between the features. The scarcity of metal in the recesses will lead to insufficient conducting compound formation in those regions and may even cause electrical discontinuities.

Figure 3:
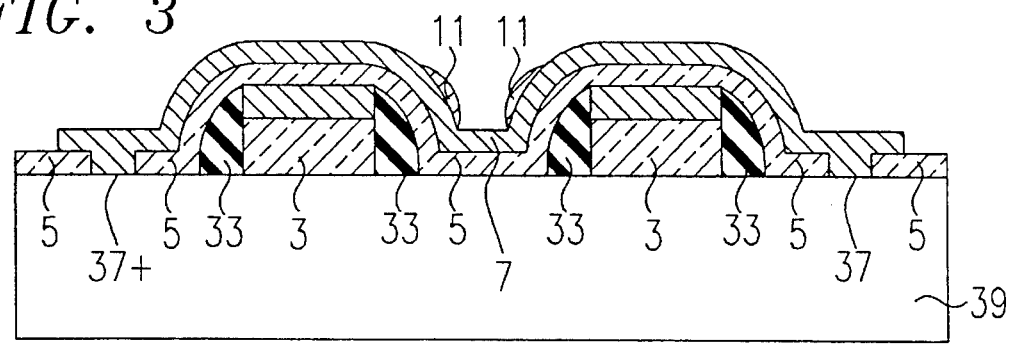

An anisotropic etchback is now performed. The greater effective thickness of the metal at the edges of the features results in fillets 11 being left in the recesses at the bottom edges between the runners. The resulting structure is depicted in FIG. 3. An appropriate etchback technique will be readily selected by those skilled in the art. It is emphasized that all required of the etchback is that metal fillets remain in the recesses after the etchback has been completed.

Figure 4:
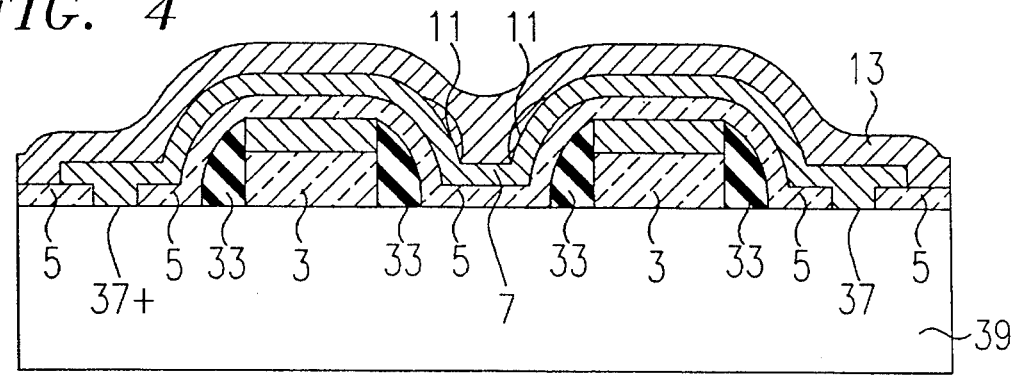

A second layer 13 of a conducting compound forming metal is now deposited by, e.g., sputtering. The structure is depicted in FIG. 4. The fillets insure that there is adequate metal for conducting compound formation present in the recesses between the features. A standard heating step is now performed to react the metal and the polysilicon to form the desired conducting compound which is a silicide in the embodiment. After completion of this reaction, unreacted metal is removed. Appropriate removal techniques will be readily selected. Standard processing techniques are now used to finish fabrication of the integrated circuit. These techniques are well known and further description is not required to understand this invention.

Variations of the embodiment described will be readily thought of by those skilled in the art. For example, silicide forming metals other than titanium may be used. Additionally, the features may be field-oxide regions of gate structures. Other variations will be readily thought of by those skilled in the art.

We claim:

1. A method of integrated circuit manufacture comprising the steps of forming a plurality of spaced-apart features on a substrate, said substrate and said features having surfaces;

depositing a layer of polysilicon and a first layer of a conducting compound forming metal on said surfaces, said metal being deposited non-conformally;

etching said metal to leave metal fillets;

depositing a second layer of conducting compound forming metal; and forming a conducting compound by heating.

2. A method as recited in claim 1 in which said conducting compound comprises a silicide.

3. A method as recited in claim 2 comprising the further step of depositing a dielectric layer on said features and said substrate.

4. A method as recited in claim 3 comprising the further step of patterning said dielectric layer prior to polysilicon deposition to expose selected portions of the substrate.

5. A method as recited in claim 4 in which said exposed portions comprise silicon.

6. A method as recited in claim 3 in which said features comprise a plurality of silicon runners.

* * * * *